(12) United States Patent
Goldstein et al.

(10) Patent No.: US 6,292,600 B1
(45) Date of Patent: Sep. 18, 2001

(54) ANGULAR-PRECISION ENHANCEMENT IN FREE-SPACE MICROMACHINED OPTICAL SWITCHES

(75) Inventors: Evan Lee Goldstein, Princeton; Lih-Yuan Lin, Middletown; Robert William Tkach, Little Silver, all of NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/472,724

(22) Filed: Dec. 27, 1999

Related U.S. Application Data

(60) Provisional application No. 60/137,838, filed on Jun. 7, 1999.

(51) Int. Cl.$^7$ ................................................ G02B 6/26
(52) U.S. Cl. ........................... 385/18; 359/223; 359/198; 359/872
(58) Field of Search ............................. 385/15–23, 147; 359/198, 199, 212, 223, 226, 871, 872

(56) References Cited

U.S. PATENT DOCUMENTS

| | | | |
|---|---|---|---|
| 5,136,671 | 8/1992 | Dragone | 385/46 |
| 5,155,623 | 10/1992 | Miller et al. | 359/495 |
| 5,206,497 | 4/1993 | Lee | 250/201.1 |
| 5,960,132 | 9/1999 | Lin | 385/18 |

OTHER PUBLICATIONS

H. Toshiyoshi et al., "Electrostatic Micro Torsion Mirrors for an Optical Switch Matrix," *Journal of Microelectromechanical Systems*, vol. 5, No. 4, Dec. 1996, pp. 231–237.

B. Behin et al., "Magnetically Actuated Micromirrors for Fiber–Optic Switching," Solid–State Sensor and Actuator Workshop, Hilton Head, South Carolina, Jun. 8–11, 1998, pp. 273–276.

K. S. J. Pister et al., "Microfabricated Hinges," *Sensors and Actuators* vol. A, No. 33 (1992), pp. 249–256, (No Month).

T. Akiyama et al., "A Quantitative Analysis of Scratch Drive Actuator Using Buckling Motion," IEEE Workshop on Micro Electro Mechanical Systems, Amsterdam, The Netherlands, Jan. 29–Feb. 2, 1995, pp. 310–315.

R.T. Chen et al., "A Low Voltage Micromachined Optical Switch By Stress–Induced Bending," $12^{th}$ IEEE International Conference On Micro Electro Mechanical Systems, Orlando, Florida, Jan. 17–21, 1999, 5 pages.

Cronos Integrated Microsystems, Inc., "Three–Layer Polysilicon Surface Micromachine Process," Aug. 24, 1999, pp. 1–8 (http://mems.mcnc.org).

L. Y. Lin et al., "Free–Space Micromachined Optical Switches for Optical Networking," *IEEE Journal of Selected Topics in Quantum Electronics*, vol. 5, No. 1, Jan./Feb. 1999, pp. 4–9.

L. Y. Lin et al., "High–Density Micromachined Polygon Optical Crossconnects Exploiting Network Connection–Symmetry," *IEEE Photonics Technology Letters*, vol. 10, No. 10, Oct. 1998, pp. 1425–1427.

*Primary Examiner*—James Phan

(57) ABSTRACT

Integrated mechanical angular alignment-enhancement structures for incorporation into free-space micromachined optical switches are capable of achieving better than 0.1° micro-mirror angular precision and repeatability with the optical switches. The structures open the path to high port-count crossconnects with sufficiently low loss for deployment in practical optical-communications networks.

17 Claims, 7 Drawing Sheets

ANGULAR-PRECISION ENHANCEMENT IN FREE-SPACE MICROMACHINED OPTICAL SWITCHES

This nonprovisional application claims the benefit of U.S. Provisional Application No. 60/137,838, filed Jun. 7, 1999.

BACKGROUND OF THE INVENTION

1. Field of Invention

This invention relates to free-space micro-electromechanical system (MEMS) optical switches. In particular, it relates to mechanical angular alignment enhancement structures associated with free-rotating hinged micro-mirror switching elements.

2. Description of Related Art

As the demand for data-networking capacity has grown, managing optical networks at the coarse granularity of the wavelength level (OC-48 and beyond) has become increasingly critical. Optical crossconnects (OXCs) with high port-count—on the order of 1,000—are emerging as the chief candidates for achieving this end. This vision, however, imposes stringent requirements on the OXCs, chiefly in the areas of port-count and loss budget, that far outstrip available technology. Recently, free-space optical MEMS (micro-electro-mechanical systems) have begun to show promise for this application, due largely to the combined merits of free-space optics and integrated photonics.

Free-space MEMS optical switches aiming at large-scale switch fabrics have been demonstrated using various approaches. See, for example, (1) H. Toshiyoshi and H. Fujita, "Electrostatic Micro Torsion Mirrors for an Optical Switch Matrix," J. Microelectromechanical Systems, vol. 5, no. 4, pp. 231–237, 1996, (2) L. Y. Lin, E. L. Goldstein, and R. W. Tkach, "Free-space Micromachined Optical Switches for Optical Networking," IEEE J. Selected Topics in Quantum Electronics: Special Issue on Microoptoelectromechanical Systems (MOEMS), vol. 5, no. 1, pp. 4–9, 1999, (3) R. T. Chen, H. Nguyen, and M. C. Wu, "A Low Voltage Micromachined Optical Switch by Stress-induced Bending," in 12th IEEE International Conference on Micro Electro Mechanical Systems, Orlando, Fla., Jan. 17–21, 1999, and (4) B. Behin, K. Y. Lau, and R. S. Muller, "Magnetically Actuated Micromirrors for Fiber-optic Switching," in Solid-State Sensor and Actuator Workshop, Hilton Head Island, S.C., Jun. 8–11, 1998, each incorporated by reference herein in their entireties.

This work has rapidly revealed the intrinsically good optical quality of free-space interconnects, particularly in the areas of crosstalk, polarization- and waveleng thin dependence, and bit-rate transparency. The demonstrated switching times are also well suited for the applications of OXCs in core-transport networks.

However, the issue of tight optical-alignment tolerances in free-space optics remains to be solved.

SUMMARY OF THE INVENTION

It is therefore an object of the invention to design micro-mirror switching elements with enhanced angular precision and repeatability so as to improve the coupling efficiency of the switch and reduce losses in optical signal intensity as a result of the switching.

This and other objects are achieved by the present invention that includes integrated mechanical angular alignment-enhancement structures that are capable of achieving better than 0.1° micro-mirror angular precision and repeatability, thus opening the path to high port-count optical crossconnects that live within cross-office optical-loss budgets.

DETAILED DESCRIPTION OF PREFERRED EMBODIMENTS

Figure 1:
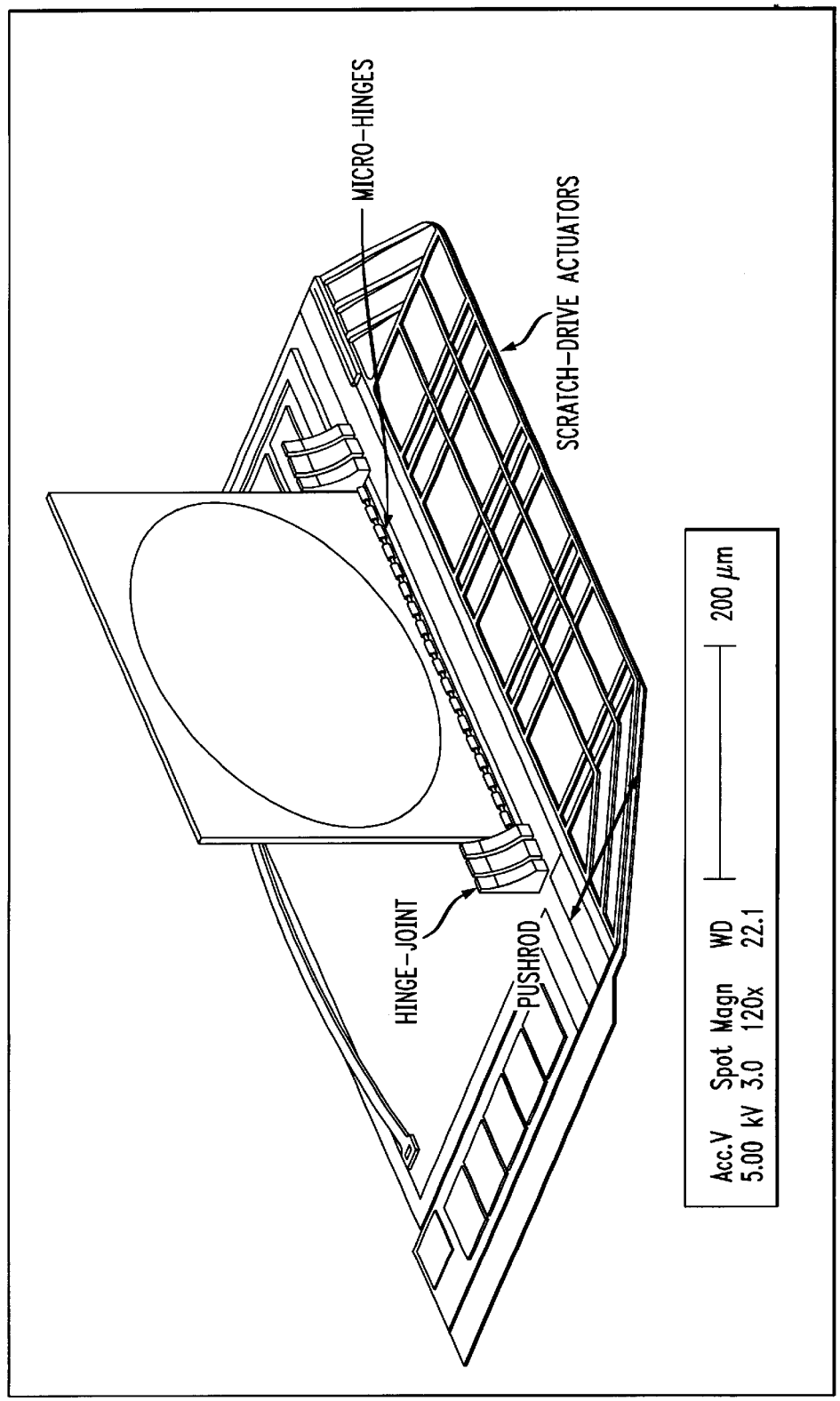
FIG. 1 is a SEM (scanning electron microscope) photograph of the free-rotating hinged micro-mirror of the invention.
Figure 2:
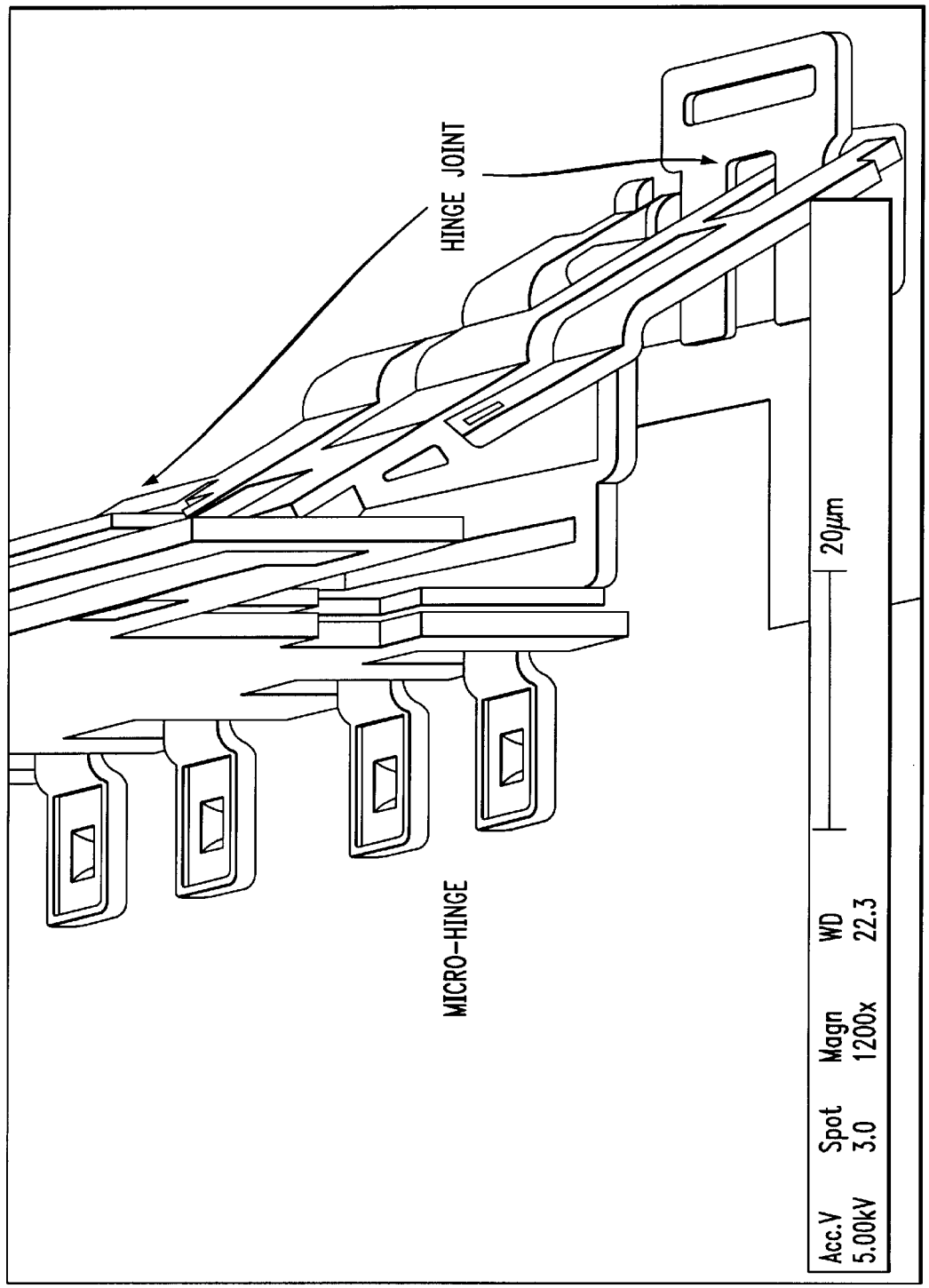
FIG. 2 is a SEM photograph detail of the pushrod of FIG. 1.
Figure 3:
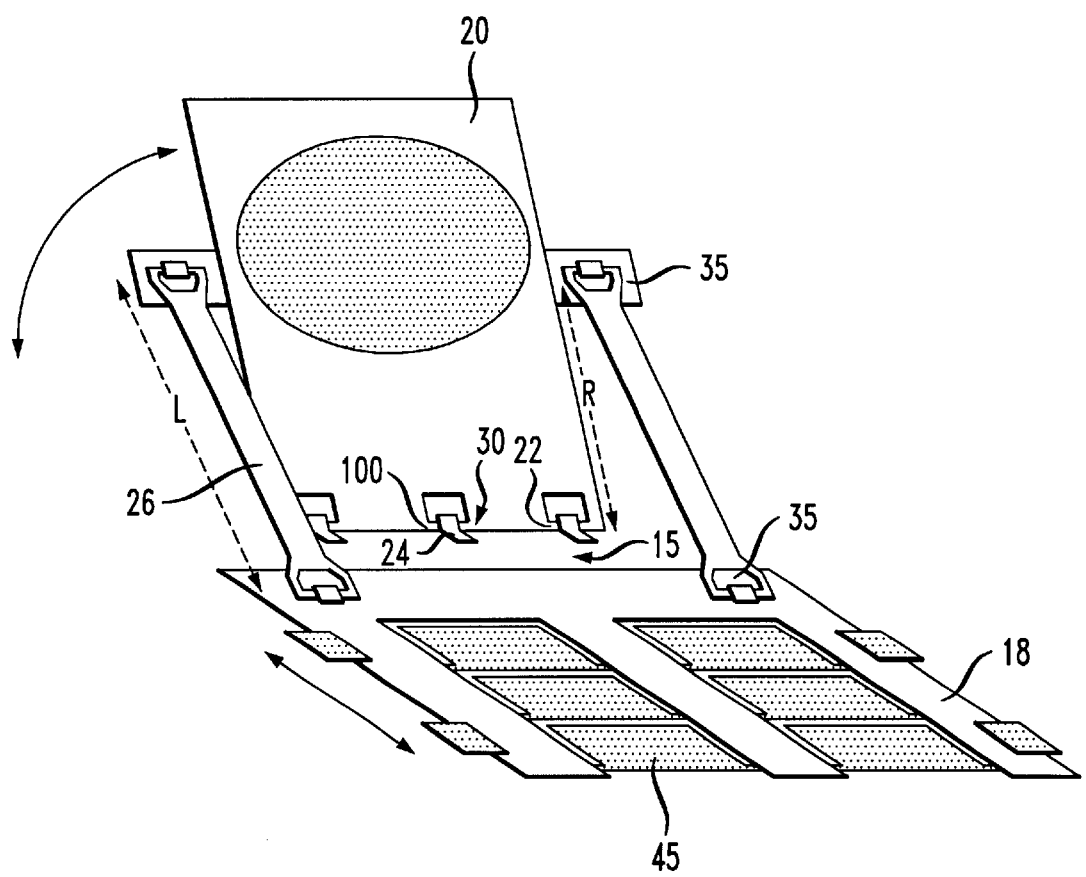
FIG. 3 is a schematic diagram of a microactuated free-rotating switch mirror.

In free-space MEMS optical switches, free-rotating hinged micro-mirrors are utilized as the switching elements.

Optical switches function to switch an optical signal from an input port, for example an input fiber, to an output port, for example an output fiber. The optical switches are located within an open, free space. The size of the matrix of input and output ports is N×M, with N and M being any integer greater than 1. An optical micro-mirror switching element is positioned, for example, at a 45° angle to the direction of an incoming optical signal from an input port, and at the intersection of each path from an input port to an output port. Incoming optical signals may be directed to the desired output port through use of the micro-mirror optical switches.

When an incoming optical signal is not to be redirected (switched) by a particular micro-mirror, the micro-mirror remains in its rest position, which is horizontal to the substrate upon which the micro-mirror is mounted, or is at least out of the plane of travel of the optical signal. However, if an optical signal is to be switched by the micro-mirror, the micro-mirror is raised to its reflecting position, which is a predetermined position and preferably is, for example, as close to perpendicular, i.e., 90°, from the substrate as possible. In this position, an incoming optical signal from an input port can be redirected to the desired output port.

The micro-mirrors of the invention may be made of any conventional material. For example, the micro-mirrors may be polysilicon, preferably made by surface micromachining, optionally coated with a highly reflective metal such as gold or Cr/Au, for example as in H. Toshiyoshi and H. Fujita, supra.

The use of free-rotating hinged micro-mirrors eliminates the potential problem of long-term material memory and fatigue, both of which are significant issues in OXCs used as facilities switches, with configuration-holding-times that may be measured in years.

One pays for this advantage of free-rotating hinge structures, however, in the form of decreased angular precision. The present invention, however, addresses this issue through the inclusion of enhanced integrated-mechanical designs for the free-rotating hinges and micro-actuators that achieve a better than 0.1° angular precision. The demonstrated angular precision shows the promise of this technology in achieving practical loss budgets in the presence of realistic fabrication constraints. Since free-space MEMS-based optical crossconnects employing single-mode fibers require angular precision better than 0.1°, mechanisms for ensuring precise angular control of the constituent micro-mirrors are important.

The free-rotating micro-mirrors 20 of the invention, for example as illustrated in FIGS. 1, 2, 3 and 11, comprise a mirror (or mirror frame) connected to the substrate 15 by free-rotating micro-hinges 30. The hinges 30 include one or more hinge pins 22 and one or more hinge staples 24. Pushrods 26 are connected at one end to the mirror (mirror frame) and at the opposite end to the translation stage 18 with hinge joints 35.

The micro-mirror, hinge and staple may be formed by any conventional process. The hinged micro-mirrors may be formed, for example, by the well-known MUMPS™ (the multi-user MEMS) process described in, for example, L. Y. Lin, E. L. Goldstein and R. W. Tkach, "Free-Space Micromachined Optical Switches for Optical Networking", IEEE Journal of Selected Topics in Quantum Electronics, vol. 5, no. 1, pp. 4–9, January/February 1999 and K. S. J. Pister, M. W. Judy, S. R. Burgett, and R. S. Fearing, "Microfabricated Hinges," Sensors and Actuators A, vol. 33, pp. 249–256, 1992, both incorporated herein by reference in their entireties. In MUMPs™, a polysilicon is used as the structural material, a deposited oxide (PSG) is used for the sacrificial layers, and silicon nitride is used as an electrical isolation layer between the silicon substrate and the polysilicon layers. The polysilicon layers are referred to as poly-0, poly-1 and poly-2.

Currently, scratch-drive actuators (SDAS) 45 are employed to move the translation stage. SDAs are conventional, and thus an extensive discussion of the function of the SDAs is not necessary herein. For a discussion of the formation and function of SDAs see, for example, T. Akiyama and H. Fujita, "A Quantitative Analysis of Scratch Drive Actuator Using Buckling Motion," in IEEE Workshop on Micro Electro Mechanical Systems, Amsterdam, the Netherlands, Jan. 29–Feb. 2, 1995, incorporated herein by reference in its entirety.

For purposes of explaining the functioning of the hinged micro-mirrors of the present invention, it is sufficient to note that through application of an appropriate voltage to the SDAs, the SDAs can be deformed or moved to a certain extent, which deformation or movement is used to move the translation stage a translation distance corresponding to the extent of deformation. Movement of the translation stage in turn causes the pushrods to act upon the mirror and rotate it to a predetermined position or angle from the substrate, typically the 90° position discussed above.

Imprecision in the angular alignment of the micro-mirror is introduced as a result of both the inherent clearance between the hinge pins and the hinge staples of the mechanism (which may be on the order of, for example, 0.75 μm) and uncertainty in the translation distance of the micro-actuators. However, we have developed in this invention effective mechanical angular alignment-enhancement structures that register micro-mirror angular position independently in the two orthogonal axes, $\theta_x$ and $\theta_y$ (defined in FIG. 1).

It should be noted here that the thickness, clearance, and other length unit measurements described herein are for the purposes of illustration. The values may vary, depending on the process used to manufacture the free-space micromachined optical switch chips. That is, the thickness of the layers in the MUMPs process may vary, which in turn varies the illustrative example values set forth herein.

The angular uncertainty in $\theta_y$ is caused mainly by clearance in the fixed microhinges. If, for example, the mirror frame has a width of, e.g., 450 μm and the inherent hinge-pin clearance is, e.g., 0.75 μm, the maximum mirror-angular variation would be $\tan^{-1}((0.75 \times 2)/450) = 0.19°$, which degree of angular imprecision will cause substantial coupling loss (i.e., loss in optical signal transmission intensity after the switching).

Figure 4:
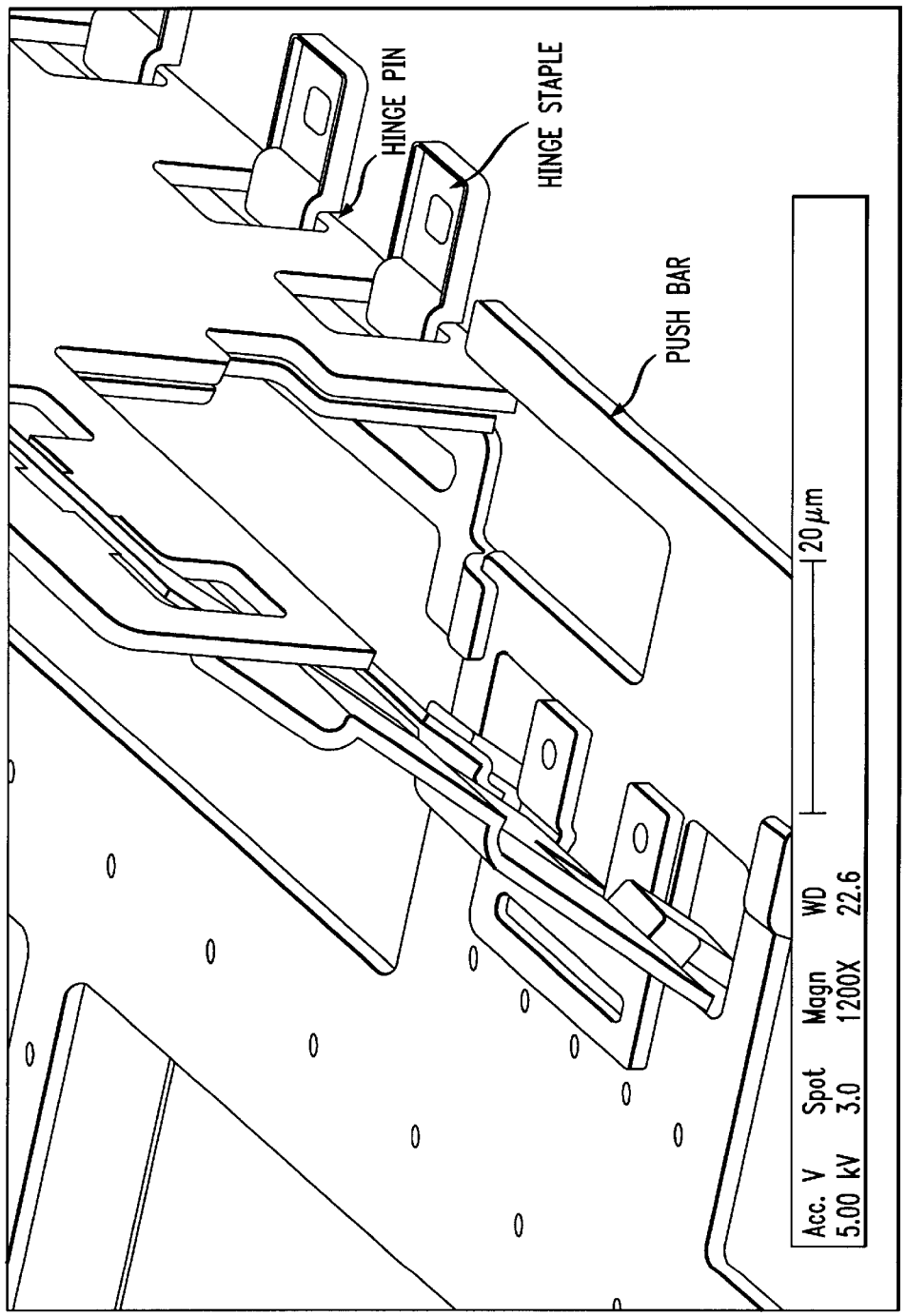
FIG. 4 is a SEM photograph of the micro-hinge and the push-bar structure for hinge-position enhancement.

To register the hinge-pin position with precision surpassing the 0.19° just mentioned, polysilicon push-bars 40 (FIGS. 4 and 11) are integrated with the translation stage according to a first embodiment of the present invention, for example as shown in FIG. 4. As the translation stage moves forward, the push-bars on both sides of the mirror frame also move forward, and eventually push the hinge pins against the inner front-side 33 of the inside of the hinge staples, thus eliminating the hinge-pin clearance and uncertainty in hinge-pin position. This then allows one to attain angular precision that is limited only by photolithography precision (i.e., the formation process precision), independent of hinge-pin clearances.

The push-bars may have any suitable configuration, so long as the push-bars are able to contact the mirror frame and/or the hinge pin of the micro-mirror and press it against a forward inner wall of one or more of the hinge staples, while at the same time having a height less than the height of the overall hinge joint so as not to interfere with the rotation of the micro-mirror.

The push-bars may be formed by any suitable process. Preferably, the push-bars are integrally formed upon the translation stage by surface micromachining of polysilicon, i.e., they are preferably formed during the same MUMPs process discussed above.

Figure 5:
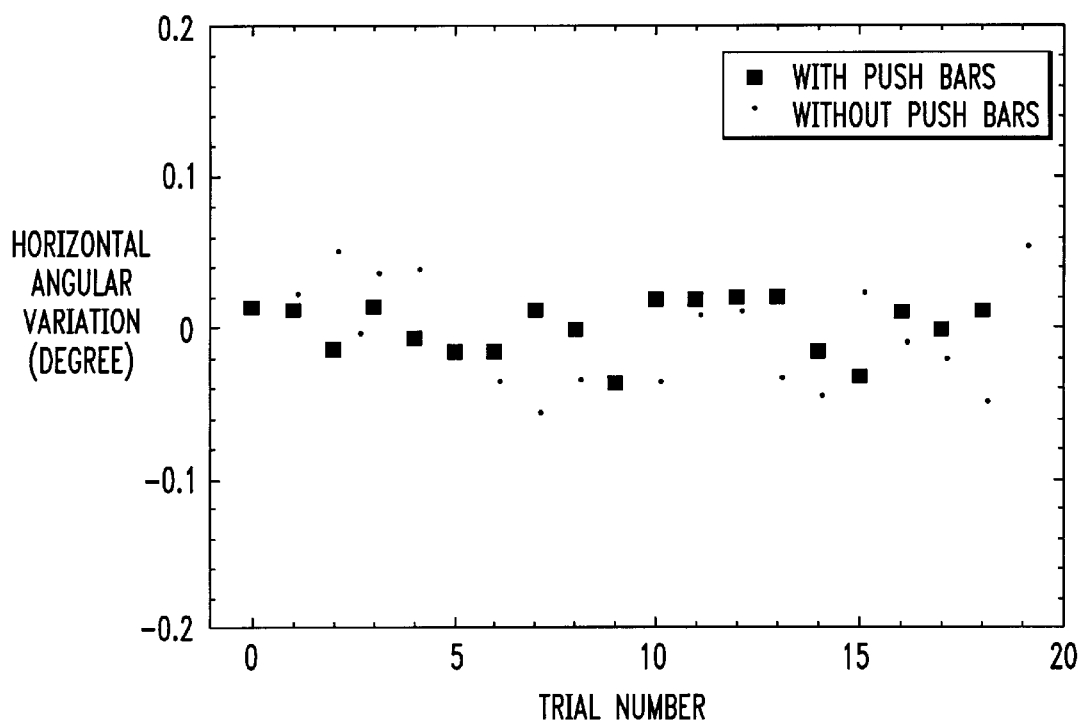
FIG. 5 is a graph of the measured horizontal angular variation with and without the push-bars.

To measure the improvement in angular location repeatability when the push-bars are used, a micro-mirror fabricated with integrated push-bars is actuated repeatedly, and the mirror angle of the actuated micro-mirror is obtained by measuring the position of the reflected optical beam on a distant screen. The same measurement is then repeated for a micro-mirror without the push-bars. FIG. 5 shows the experimental results. With the push-bars, the maximum $\theta_y$ variation is reduced from 0.056° to 0.034°. The results without the push-bars are also much more widely varied.

Use of the push-bars as an integrated mechanical angular alignment-enhancement structure thus significantly improves upon the angular precision of the micro-mirrors.

The vertical angular variation ($\theta_x$) appears to depend mainly on three variables: (1) the clearance in the fixed micro-hinges, (2) the clearance in the hinge-joints at the pushrod endpoints and (3) the moving distance of the translation stage. The first source of variation is squeezed out by the push-bar structures as described above. However, even with this substantial improvement through the use of push-bars, without further improvement in the other two variables, a vertical angular variation greater than 1° has still been observed, due to angular uncertainties in the orthogonal direction. Two additional mechanical angular alignment-enhancement structures, separately described below, may thus also preferably be employed in the invention.

Figure 6:
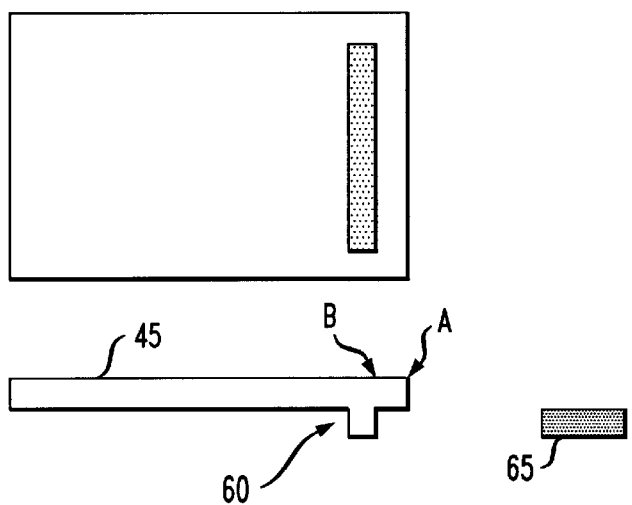
FIG. 6 is a diagram of a conventional scratch drive actuator (SDA) design, where the stop position of the SDA is not clearly defined.

With the scratch-drive actuators (SDAs), the moving distance of the translation stage effected by the SDAs is mainly determined by the traveling distance of the SDAs. In conventional SDA design where fabrication tolerance is considered, the bushing of the SDA is located at a position approximately 2 $\mu$m from the advancing edge of the SDA as shown in FIG. 6. The SDA travels until it hits the stop block 65 on the substrate.

The most reliable way to make a stop block with vertical side walls and without affecting the flatness of the underlying silicon nitride layer is by utilizing the poly-0 layer in the MUMPs process described above. This layer may have a thickness of, for example, ~0.5 $\mu$m. The bushing of the SDA is defined by the poly-2 layer atop the poly1-poly-2-via. The bushing may have a nominal height of, for example, 0.75 $\mu$m. Since these two heights (i.e., the height of the poly-0 layer and the height of the bushing) are comparable, and the SDA height varies under actuation (as explained in T. Akiyama and H. Fujita, supra), the position at which the SDA comes to rest against the stop block 65 varies. Experimentally, various positions between A and B in FIG. 6 have been observed during actuations, resulting in angular uncertainties on the order of, and greater than, 1°.

Figure 7:
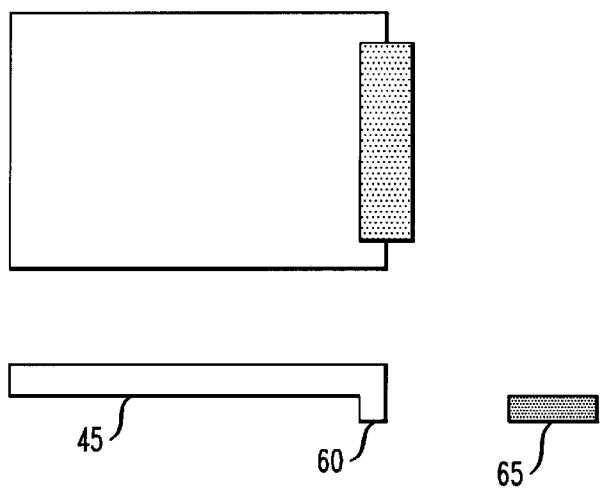
FIG. 7 is a diagram of the improved SDA design of the invention, where the stop position of the SDA is clearly defined when the front-wall of the bushing hits the stop block.

In order to eliminate this uncertainty, use is made herein of a spatially extended poly-1-poly-2-via pattern, as shown in FIG. 7. The SDA forward edge is thus vertically defined by ion etching, for example as in the MUMPs process discussed above. As can be seen from FIG. 7, the poly-1-poly-2-via is extended. Through this design, a true "L"-shaped SDA is formed, in which the bushing 60 of the SDA 45 abuts, or is at, an end outer edge of the SDA. This acts to always stop the SDA when the front of its bushing contacts the stop block 65, adding certainty to the stop point unlike the SDA design of FIG. 6.

To measure the resulting improvement in angular precision with the L-shaped SDA, a micro-mirror with the L-shaped SDA structure is actuated repeatedly. The angular variation is plotted as circular data points in FIG. 8. The angular precision is seen to improve from ~1° with the SDA of FIG. 6 to 0.15° with the SDA of FIG. 7 of the invention.

Another uncertainty in controlling vertical angular precision arises from clearance in the free-rotating hinge joints. In a prior hinge joint, the hinge pin has a uniform width of, for example, 2 $\mu$m. During actuation, the poly-2 pushrods attached to the hinge pin are allowed to rotate and slide freely in a 6-$\mu$m slot on the poly-1 translation plate. See FIGS. 1, 2, 3 and 4. This yields uncertainty in the position of the hinge pin, and therefore in the angle of the pushrod and the micro-mirror. To address this uncertainty, a further mechanical alignment-enhancement structure has been developed in this invention. In particular, an improved free-rotating hinge joint is designed and found to minimize the effect of the clearance in the free-rotating hinge joints.

Figure 9:
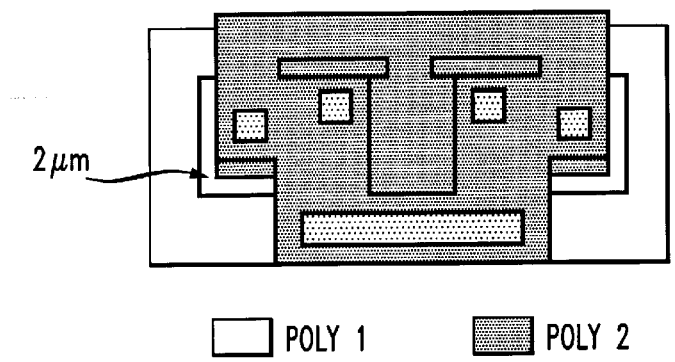
FIG. 9 is a diagram layout of a conventional hinge joint.
Figure 10:
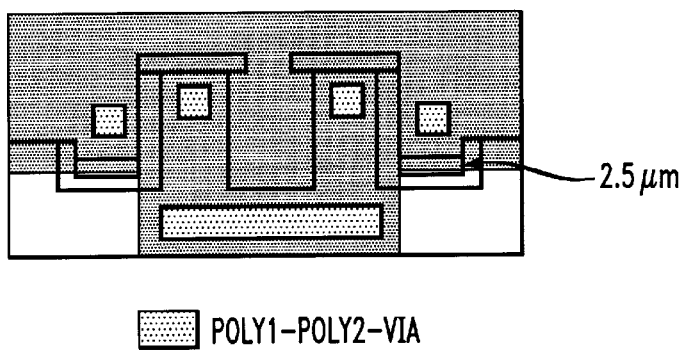
FIG. 10 is a diagram layout of the improved hinge joint of the invention. The hinge-pin position is restrained in the improved design.
Figure 11:
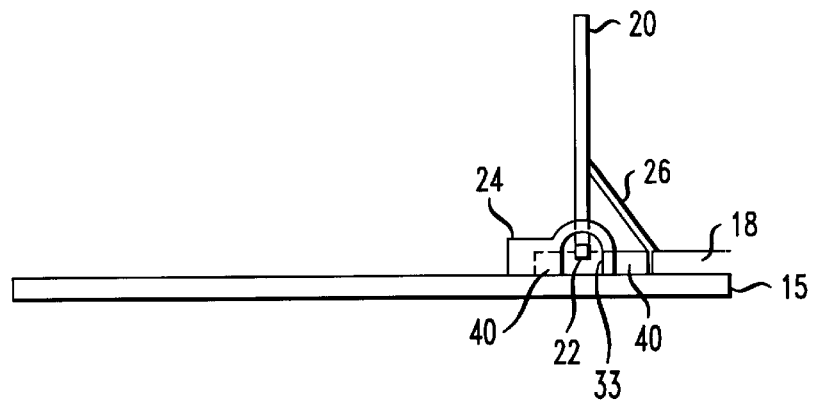
FIG. 11 is a diagram of the basic rotational components of the micro-mirror.

FIGS. 9 and 10 illustrate the layout for the original and the improved hinge joints. The translation stage is connected to the poly-1 layer, which has a thickness of, for example, 2 $\mu$m. The hinge staple is made from, for example, the poly-2 layer. The clearance between the poly-2 hinge staple and the substrate (the area where the hinge pins go) may be, for example, 2.75 $\mu$m. This is measured from the height of the substrate to the interior edge of the hinge staple, In the design of this invention, the part of the hinge pin that is not covered by the poly-2 hinge staples (portion 100 in FIG. 3) is enlarged to a width greater than the width of the hinge pin within the hinge staples by, for example, 0.3 $\mu$m, preferably 0.5 $\mu$m, or more. Thus, if the hinge pins within the hinge staples have a width of 2 $\mu$m, the hinge pins outside of the hinge staples should have a width of at least 2.3 $\mu$m, and most preferably have a width of about 2.5 $\mu$m. The hinge pin within the hinge staple retains a smaller width to preserve its flexibility.

As discussed above, the mirror switch is formed in the MUMPs process. The hinge pins are thus formed photolithographically. In order to adjust the width of the hinge pins, it is simply a matter of altering the geometry of the photolithographic pattern of the hinge pin layout as viewed from above. This is illustrated in FIGS. 9 (conventional layout) and 10 (improved layout of the present invention).

As the pushrod is rotated with this hinge pin arrangement, the hinge pin starts to touch contact the hinge staple when the mirror angle approaches the predetermined position, for example 90° (pushrod angle ~70°), because of the greater width of the hinge pin at portions outside of the hinge staples. The pressure from the hinge staple presses the hinge pin down and backward, thus preventing it from sliding and thereby still further improving the angular variation.

Figure 8:
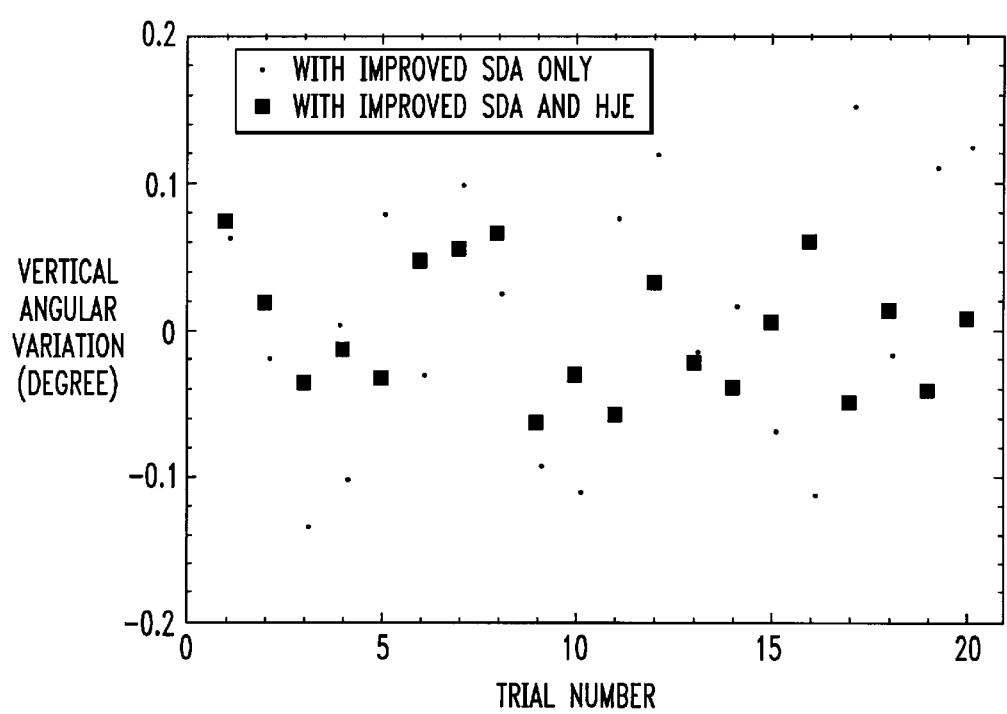
FIG. 8 is a graph of the measured vertical angular variation for both (1) the improved SDA only and (2) the improved SDA with the HJE (hinge-joint enhancement).

With this hinge-joint enhancement (HJE) structure in addition to the improved SDA described earlier, the maximum angular variation is further reduced to 0.074°, as shown in FIG. 8.

As has been discussed above, the maximum improvement in angular precision is achieved when all three of the integrated mechanical angular alignment-enhancement structures described herein are utilized together. However, it is also an aspect of this invention to use any of the integrated mechanical alignment-enhancement structures independently, or any combination of two of the mechanical angular alignment-enhancement structures together, in any particular application to derive the benefits offered by the integrated mechanical alignment-enhancement structures selected.

We have thus designed and demonstrated integrated mechanical structures that substantially enhance the angular repeatability of a MEMS crossconnect's micro-mirrors beyond limits that were observed in simple, first-generation devices. Measurements show that angular precision better than 0.1° can be achieved. The results point towards what appears to be a practical route to optical crossconnects that offer both the port-count and the loss budgets needed in emerging high-capacity core-transport networks.

What is claimed is:

1. An optical switching element comprising:
   a micro-mirror attached to a substrate through one or more hinge joints comprised of a hinge pin and a hinge staple, the hinge staple being attached to the substrate,
   one or more pushrods associated with the micro-mirror, and capable of rotating the micro-mirror upon movement of a translation stage, and
   at least one mechanical angular alignment-enhancement structure.

2. The optical switching element of claim 1, wherein the micro-mirror is mounted within a frame integral with the hinge joints.

3. The optical switching element of claim 1, wherein the pushrods are attached at one end to the micro-mirror by a hinge joint and are attached at an opposite end to the translation stage by a hinge joint.

4. The optical switching element of claim 1, wherein the at least one mechanical angular alignment-enhancement structure is selected from the group consisting of one or more push-bars upon the substrate, one or more scratch drive actuators having a bushing abutting an end edge of the actuator, and one or more hinge pins having a width in portions of the hinge pin outside of the hinge staples greater than a width of portions of the hinge pin inside of the hinge staples.

5. The optical switching element of claim 1, wherein the at least one mechanical angular alignment-enhancement structure is one or more push-bars upon the substrate.

6. The optical switching element of claim 5, wherein the one or more push-bars are movable upon movement of the translation stage.

7. The optical switching element of claim 5, wherein the one or more push-bars move to press one or more hinge pins of the micro-mirror against a forward inner wall of one or more of the hinge staples.

8. The optical switching element of claim 1, wherein the at least one mechanical angular alignment-enhancement structure is one or more scratch drive actuators having a bushing at an end edge of the actuator.

9. The optical switching element of claim 1, wherein the at least one mechanical angular alignment-enhancement structure is one or more hinge pins having a width in portions of the hinge pin outside of the hinge staples greater than a width of portions of the hinge pin inside of the hinge staples.

10. The optical switching element of claim 9, wherein the portions of the hinge pin outside of the hinge staples have a width greater than the width of portions of the hinge pin inside of the hinge staples by 0.3 $\mu$m or more.

11. The optical switching element of claim 10, wherein the portions of the hinge pin outside of the hinge staples have a width greater than the width of portions of the hinge pin inside of the hinge staples by 0.5 $\mu$m or more.

12. A method of achieving angular alignment precision of at least 0.1° with a micro-mirror of an optical switching element at a predetermined angle from a substrate upon which the micro-mirror is mounted when rotating the micro-mirror to the predetermined angle, the optical switching element comprising the micro-mirror attached to a substrate through one or more hinge joints comprised of a hinge pin and a hinge staple, the hinge staple being attached to the substrate, one or more pushrods associated with the micro-mirror, and capable of rotating the micro-mirror upon movement of a translation stage, and at least one mechanical angular alignment-enhancement structure, the method comprising moving the translation stage with one or more scratch drive actuators to move the pushrods and rotate the micro-mirror via the one or more hinge joints, and positioning the micro-mirror at the predetermined angle within 0.1° precision, the precision achieved via the at least one mechanical alignment-enhancement structure.

13. The method according to claim 12, wherein the at least one mechanical angular alignment-enhancement structure is selected from the group consisting of one or more push-bars upon the substrate, one or more scratch drive actuators having a bushing at an end edge of the actuator, and one or more hinge pins having a width in portions of the hinge pin outside of the hinge staples greater than a width of portions of the hinge pin inside of the hinge staples.

14. The method according to claim 12, wherein the at least one mechanical angular alignment-enhancement structure is one or more push-bars upon the substrate, the one or more push-bars moving upon movement of the translation stage to press one or more hinge pins of the hinge joints against a forward inner wall of one or more of the hinge staples.

15. The method according to claim 12, wherein the at least one mechanical angular alignment-enhancement structure is one or more scratch drive actuators having a bushing at the end edge of the actuator, the scratch drive actuators effecting precise movement of the translation stage to achieve the precision in the positioning of the micro-mirror.

16. The method according to claim 12, wherein the at least one mechanical angular alignment-enhancement structure is one or more hinge pins having a width in portions of the hinge pin outside of the hinge staples greater than a width of portions of the hinge pin inside of the hinge staples by 0.5 $\mu$m or more.

17. A method of rotating a micro-mirror of an optical switching element to a predetermined position from a substrate upon which the micro-mirror is mounted, the optical switching element comprising the micro-mirror attached to a substrate through one or more hinge joints comprised of a hinge pin and a hinge staple, the hinge staple being attached to the substrate, one or more pushrods associated with the micro-mirror, and capable of rotating the micro-mirror upon movement of a translation stage, and at least one mechanical angular alignment-enhancement structure, the method comprising moving the translation stage with one or more scratch drive actuators to move the pushrods and rotate the micro-mirror via the one or more hinge joints, and positioning the micro-mirror at the predetermined position within 0.1° precision, the precision achieved via the at least one mechanical alignment-enhancement structure.

* * * * *